United States Patent [19]
Ohmi et al.

[11] Patent Number: 5,415,718
[45] Date of Patent: May 16, 1995

[54] REACTIVE ION ETCHING DEVICE

[75] Inventors: Tadahiro Ohmi, 1-17-301, Komegabukuro 2-chome, Aoba-ku, Sendai-shi, Miyagi-ken 980; Yasuhiko Kasama; Hirobumi Fukui, both of Sendai, all of Japan

[73] Assignees: Tadahiro Ohmi, Miyagi; Alps Electric Co., Ltd., Tokyo, both of Japan

[21] Appl. No.: 763,376

[22] Filed: Sep. 20, 1991

[30] Foreign Application Priority Data

Sep. 21, 1990 [JP] Japan .................. 2-252847

[51] Int. Cl.$^6$ ........................................... H01L 21/00
[52] U.S. Cl. ...................... 156/345; 216/61; 216/67
[58] Field of Search ............... 156/345, 626, 627, 643; 118/723; 204/298.32, 298.03, 192.13, 192.33

[56] References Cited

U.S. PATENT DOCUMENTS

| | | | |
|---|---|---|---|
| 4,602,981 | 7/1986 | Chen et al. | 156/345 |
| 4,622,094 | 11/1986 | Otsubo | 156/627 |

FOREIGN PATENT DOCUMENTS

| | | |
|---|---|---|
| 56-007432 | 1/1981 | Japan . |
| 57-023226 | 2/1982 | Japan . |
| 58-079722 | 5/1983 | Japan . |
| 63-069987 | 9/1986 | Japan . |
| 62-085431 | 4/1987 | Japan . |
| 01302820 | 12/1989 | Japan . |
| 02035724 | 2/1990 | Japan . |
| 89188 | 3/1990 | Japan . |
| 03181127 | 8/1991 | Japan . |

OTHER PUBLICATIONS

International Electron Devices Meeting 1989, Technical Digest No. 89CH2637-7, IEEE, pp. 53-56 entitled "In Situ-Doped Epitaxial Silicon Film Growth at 250° C. By An Ultra-Clean Low-Energy Bias Sputtering".

Primary Examiner—R. Bruce Breneman
Assistant Examiner—George Goudreau
Attorney, Agent, or Firm—Baker & Daniels

[57] ABSTRACT

An object of this invention is to provide an RIE apparatus, for instance, with which conditions for an etching process such as an etching speed can be set easily, precisely, and with repeatability, by, for instance, introducing a novel concept that is the flow rate of charged particles which can directly be measured as a quantity proportional to the quantity of bombarded ions.

Accordingly, this invention is characterized in that said reactive ion etching apparatus has an electrode potential detecting means which detects the electric potential of said electrodes, a high-frequency power detecting means which detects an output from said high frequency power supply, a first computing means which computes an ion energy of said ions produced in a process of reactive ion etching based on said electric potential, a second computing means which computes the flow rate of charged particles related to said ions based on said detected output, and a control means which controls at least one of the following; the quantity of a gas led into said reaction chamber, an exhaust speed in said reaction chamber, and output from said high-frequency power supply, and the frequency of said high-frequency power, based on the result of an output from at least one of the aforesaid first computing means and said second computing means.

8 Claims, 5 Drawing Sheets

REACTIVE ION ETCHING DEVICE

BACKGROUND OF THE INVENTION

This invention relates to a reactive ion etching (RIE) apparatus for producing, for instance, semiconductor devices, and more particularly for etching anisotropically various types of thin films which constitute an integrated circuit in a plasma space.

A conventional type of RIE apparatus has a reaction chamber having an exhaust means and a gas leading-in means, and also a pair of electrodes therein facing each other, in which plasma is generated by supplying a high frequency electrical field to said pair of electrodes therein and a thin film placed on one of said electrodes as an object to be processed is etched in said plasma space.

In the case where such a conventional RIE apparatus is used, in order to set a condition for an etching process such as, for instance, an etching speed, the following types of data correlated to an etching speed are collected prior to the etching process; the quantity of a gas fed into a reaction chamber, an exhaust speed in said reaction chamber, and an output from a high frequency power supply. With these various types of data, factors for determining an etching speed are controlled indirectly by using an experimenter's sense of experience. Referring to FIG. 9 which shows an example of such types of data, the etching speed (A/min) is plotted along the ordinate against an output from a high frequency power supply (W) which is plotted along the abscissa, with three resulting curves each corresponding to the pressure (85, 300, 500 mTorr) in a reaction chamber used as a parameter.

Other conditions for an etching process include conditions to minimize damages to a base material and those to select a base material and a material to be etched. In any of the cases using these conditions, a complicated method as described above is used to set each condition for an etching process.

Another known method is that a probe is inserted in a plasma space during an etching process to observe the state of ions in the plasma which heavily affects the etching process in order to change each condition.

However, with a conventional RIE apparatus having the structure as described above, two much time and labor are consumed to set conditions for an etching process.

Furthermore, those methods are based on indirect control, which makes improvement in its precision difficult. For instance, when a probe is inserted, it may cause disturbance in said plasma or contamination on an object to be processed.

For the above-described reasons, the structure based on the prior art as described above hinders the work from being processed smoothly or the quality of an object to be processed from being improved. The prior art can not be applied to work in an actual industrial production site to obtain satisfactory results, although it may produce tolerable results in a laboratory.

Regarding RIE, it is well known that ions bombarded to a surface to be etched, or more particularly the energy and the quantity of ions bombarded to a surface to be etched, play important roles in an etching process, and yet a practical method for directly controlling these physical quantities has not yet been found.

The purpose of this invention is to provide an RIE device, wherein conditions for an etching process such as an etching speed can be set easily, precisely and with a high reliability. To accomplish this object, this invention adopts a new concept, the flow rate of charged particles, which is a quantity proportional to the quantity of bombarded ions and can directly be measured.

SUMMARY OF THE INVENTION

In order to accomplish the above-described purpose, this invention proposes to provide a reactive ion etching apparatus comprising a reaction chamber having at least an exhaust means and a gas leading-in means, electrodes disposed in said reaction chamber, and a high-frequency power supply connected to said electrodes so as to generate plasma in a space above said electrodes, wherein ions in said plasma are bombarded to an object placed on one of said electrodes to be processed.

The improvement comprises an electrode potential means for detecting an electric potential of said electrodes, a high-frequency power detecting means which detects an output from said high-frequency power supply, a first computing means in a process of reactive ion etching based on said detected electric potential, a second computing means which computes a flow rate of charged particles related to said ions based on detected output, and a control means which controls at least one of the following: the quantity of a gas led into said reaction chamber, an exhaust speed in said reaction chamber, an output from said high-frequency power supply, and a frequency of said high-frequency power, based on the result of an output from at least one of said first computing means and said second computing means.

As a high frequency electrical field is formed in a space above said electrodes in said reaction chamber and plasma is generated therein, the first computing means and the second computing means compute the ion energy of ions produced in a process of the RIE and the flow rate of charged particles whenever necessary. The term "ion energy" is a term used to described the energy of ions in said plasma produced in a process of the RIE, or in other words, the ion energy of cations which are accelerated by the potential difference generated between said plasma and said electrodes and are colliding with one of said electrodes. The term "flow rate of charged particles" is a term used to describe the total quantity of ions and electrons flowing into one of said electrodes per specified unit of time.

With this configuration, the control means compares, for instance, those outputs from said first computing means and said second computing means with a specified ion energy and a specified flow rate of charged particles, and controls the quantity of a specified gas led into said reaction chamber, the speed of discharging the atmosphere in said reaction chamber, the output from said high frequency power supply, the frequency and other factors so that the difference between actual outputs and specified values will be zero or within a specified range.

That is, conditions for an etching process such as an etching speed can be set easily, precisely and with reliability without relying on an operator's sense or experience, by means of directly controlling the ion energy bombarded to an RIE and the flow rate of charged particles flowing into one of those electrodes connected to said high frequency power supply.

DETAILED DESCRIPTION OF THE INVENTION

Figure 1:
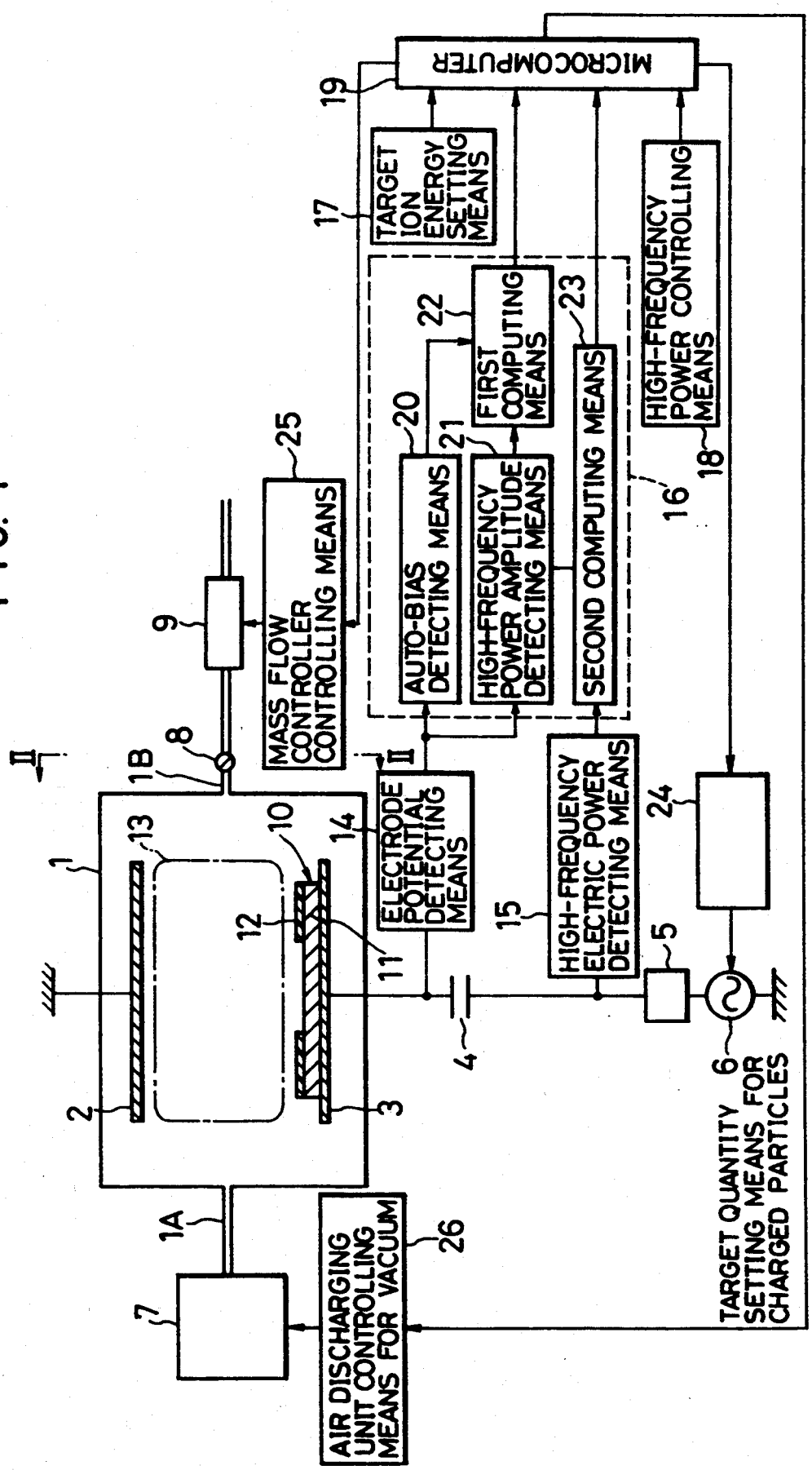
FIG. 1 is a drawing which illustrates the structure of an RIE device according to this invention.
Figure 2:
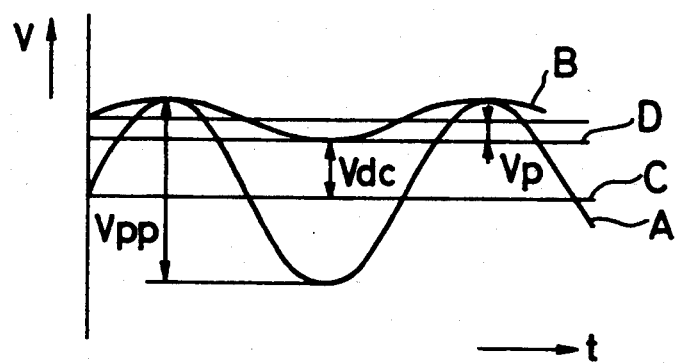
FIG. 2 is a graph plotting the electric potential in the reaction chamber illustrated in FIG. 1, against time.

FIG. 1 is a diagram illustrating a first embodiment of this invention. A reaction chamber 1 contains a pair of flat electrodes 2 and 3 facing each other, with said electrode 2 grounded and said electrode 3 connected to a high frequency power supply 6 through a blocking capacitor 4 and a matching circuit 5.

On the other hand, in said reaction chamber are arranged an exhaust pipe 1A and an air intake pipe 1B. An exhaust unit 7 which comprises a vacuum pump and other equipment for discharging the air from said reaction chamber is connected to said exhaust pipe 1A, and a valve 8 for leading a specified gas (such as a tetrafluoromethane($CF_4$)-based etching gas) in said reaction chamber from a gas supply source which is not illustrated in FIG. 1, and a mass flow controller 9 for controlling the quantity of a gas led into the reaction chamber are attached to said intake pipe 1B.

On said electrode 3, a device 10 in a production process as an object to be processed is placed, and said device 10 comprises a mask 12 on the surface of an Si substrate or the like. Between the electrodes 2 and 3, plasma 13 is generated as approximately shown by the chain line.

At the contact point of said electrode 3 with said blocking capacitor 4, an electrode potential detecting means (such as an oscilloscope) 14 is connected, while, at the contact point of said blocking capacitor 4 with said matching circuit 5, a high-frequency power detecting means 15 is connected. Accordingly, those outputs from said electrode potential detecting means 14 and said high-frequency power detecting means 15 are sent to a computing means 16.

Said computing means 16 comprises a first computing means 22 which computes the ion energy of ions in said plasma based on both those outputs from a self-bias detecting means 20 and a high-frequency wave amplitude detecting means 21, and a second computing means 23 which computes the flow rate of charged particles in which said ions are involved based on both those outputs from said high-frequency power detecting means and said high-frequency wave amplitude detecting means 21.

Said "ion energy" is a term used to describe the ion energy of cations which are accelerated by the potential difference generated between said plasma and said electrodes 2 and 3 and are colliding with the electrode 3. The term "flow rate of charged particles" is a term used to describe the total quantity of ions and electrons flowing into the electrode per specified unit of time.

Said self-bias detecting means 20 and the aforesaid high-frequency power amplitude detecting means 21 receive output data from said electrode potential detecting means 14, and output a self-bias value and a high-frequency power amplitude value, respectively, using the data. The term "self-bias value" is a term used to describe an average value of the high-frequency electric potential generated between the electrode 3 and the ground. The term "high-frequency power amplitude value" is a term to describe the difference between the maximum and minimum values of the high-frequency electric potential at said electrode 3 (a so-called peak-to-peak).

The result computed by said first computing means 22 is processed by a computing means of a microcomputer 19 and compared with an output from a target ion energy setting means 17, and the result computed by said second computing means 23 is processed by the same comparing means and computed with an output from a means for setting a target flow rate of charged particles, although the comparing means is not illustrated in FIG. 1. An output from said comparing means is sent to each of the high-frequency power supply controlling means connected with the high-frequency power supply 6, the mass flow controlling means 25 connected with the mass flow controller 9, and the exhaust unit controlling means 26 for vacuum connected with the exhaust unit 7 for vacuum.

Said high-frequency power supply controlling means 24 is used to change the output and frequency of said high-frequency power supply 6, and the mass flow controller controlling means 25 is used to change the quantity of a gas or gases led into said reaction chamber 1 per specified unit of time. In the case where more than one gas is used, the total quantity of the gases is calculated by maintaining a flow rate ratio of each gas at a constant level.

Also, said exhaust unit controlling means 26 for vacuum is used to adjust the opening of a valve (not shown) attached to the exhaust pipe A and the like so as to change the speed of discharging the atmosphere in the reaction chamber 1. The gas pressure in the reaction chamber 1 is calculated by dividing the aforesaid gas flow rate by the exhaust speed.

As an output from said high frequency power supply 6 is increased, both the ion energy and the flow rate of charged particles increase. On the other hand, as the frequency of the high-frequency power supply and the gas pressure increases, the ion energy decreases while the flow rate of charged particles increases. That is, the control using a change in the frequency is equivalent to the control using a change in the gas pressure, and therefore the control can be performed, for instance, by adjusting only the frequency in the case where the gas pressure cannot be increased any more because of the high probability of collision between ions that prevents an anisotropy for etching from being generated.

Said first computing means 22 computes the ion energy, and said second computing means 23 computes said flow rate of charged particles. Description is made hereinunder for the method of computing these values.

Figure 3:
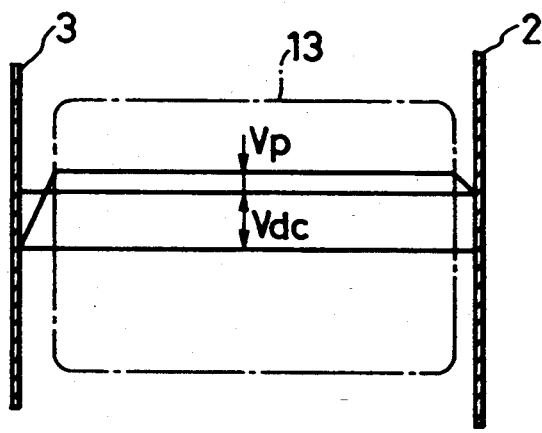
FIG. 3 is an outline side view.

By using an oscilloscope as said electrode potential detecting means 14, the observed result is illustrated along the ordinate and time along the abscissa. The resulting curve A illustrates the high-frequency electric potential at the electrode 3. Curve B illustrates the plasma potential of said plasma 13. Curve C illustrates the average electric potential at said electrode 3. The straight line D illustrates the electric potential at said electrode 2 (the ground electric potential). As for the observed values Vdc, Vpp, and Vp, indicated by the arrows, Vdc shows said auto-bias at said electrodes 3, Vpp shows the high-frequency power amplitude at said electrode 3, and Vp shows the average electric potential of the aforesaid plasma. FIG. 3 illustrates the electric potential distribution in said reaction chamber 1, viewed from the right-hand side on FIG. 1.

In an RIE, the quantity of the ion energy represented by Eion is determined by the voltage loaded to the sheath of said electrode 3, in other words, said self-bias value and the average electric potential value of said plasma potential. Therefore, the Eion is obtained by substituting said observed values for Vdc and Vpp in the following formula (I):

$$Eion = (\tfrac{1}{2}) \times Vdc + (\tfrac{1}{2}) Vpp \qquad (I)$$

Said flow rate of charged particles is determined by those charged particles flowing into the aforesaid electrode 3, and as Flux in the following formula (II):

$$Flux = Pwrf/Vpp \qquad (II)$$

where Pwrf is the high-frequency electric power supplied to said electrode 3, and thus the dimension of flow rate of charged particles Flux is the same as that of current. That is, said flow rate of charged particles Flux corresponds to the quantity of ions flowing into the surface to be etched. The idea of using said flow rate of charged particles Flux as a parameter that is proportional to the quantity of ions bombarded to a surface to be etched has been introduced for the first time by this inventor, and as described later, usefulness of this idea was demonstrated by measuring the etching speed or damages using the RIE according to this invention.

Description is hereunder for operations of the embodiment having the structure described above with reference to the flow chart in FIG. 4 and other drawings.

The reaction chamber 1 is sealed with an almost perfect vacuum therein after the air has been discharged by said exhaust unit, and then the valve 8 is opened and tetrafluoromethane (CF$_4$)-based etching gas is fed into said reaction chamber from a gas supply source (not shown in the drawing) so that the gas pressure in the reaction chamber is in a range from $10^{-4}$ Torr to 1 Torr.

Then, when said high-frequency power supply 6 is turned on to form a high-frequency electrical field between said electrodes 2 and 3, the plasma 13 is generated and said etching gas is decomposed into fluoric radical F$^-$ or cations such as CF$_3^+$ and CF$_2^+$.

During this process, an oscillation frequency of 13.56 MHz is generally used as the output frequency of the high-frequency power supply 6.

When said device 10 is exposed to the plasma 13, the surface of the Si substrate 10 is activated because ions such as CF$_2^+$ in the plasma 13 are bombarded to said surface to be etched according to said self-bias. Such ions as F$^-$ are deposited on the activated surface to be etched, and thus a reaction with Si is aided, and the etching process is speeded up.

That is, those ions such as CF$_2^+$ and radicals such as F$^-$ which are produced in said plasma 13 work concurrently on the surface to be etched, and in this way speed up the etching process.

As described above, ions bombarded to a surface to be etched, more particularly, the energy and the quantity of ions bombarded on the surface, play important roles in the RIE method.

Figure 4:
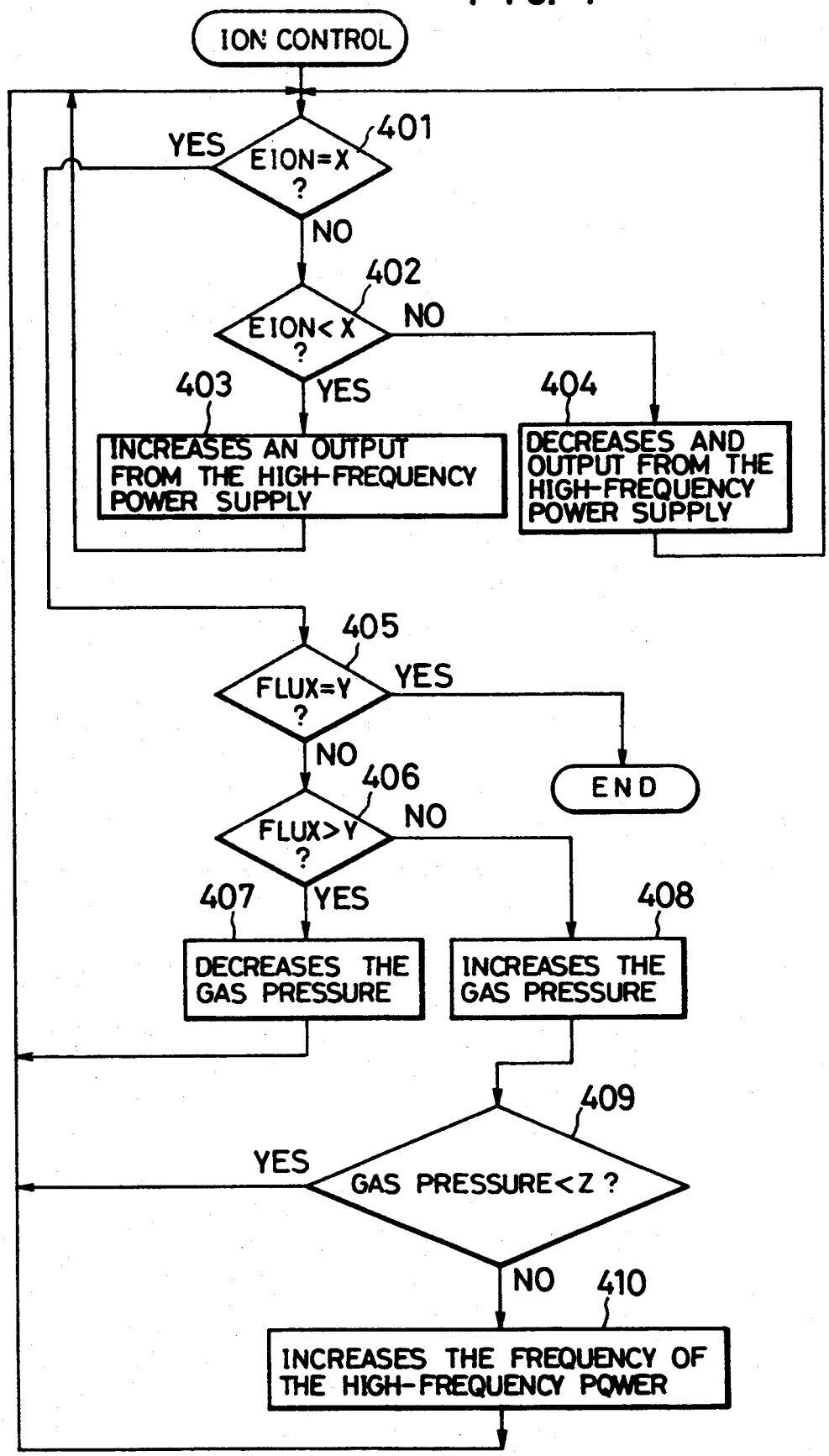
FIG. 4 is a flow chart showing operation of the device illustrated by FIG. 1.

When said plasma 13 is generated, the microcomputer 19 starts running a program for controlling ions in said reaction chamber, as FIG. 4 shows.

In this program, the ion energy Eion is checked at step 401 as to whether the Eion is equal to a specified value X (or within a specified range of values) or not. If the Eion is not equal to the specified value X or not within the specified range of values (No at 401), the process goes to step 402 where said energy Eion is checked whether said Eion is less than the specified value X or not. If the Eion is greater than the specified value X (Yes at 402), the process goes to step 403, where an output from the high-frequency power supply 6 is increased. If the Eion is greater than the specified value X (No at 402), the process goes to step 404, where an output from said high-frequency power supply 6 is decreased. In either case (at 403 or 404), the process returns to said step 401.

When the Eion gets equal to the specified value X (Yes at 401), the process goes to step 405 where the flow rate of charged particles Flux is equal to a specified value Y (or within a specified range of the values). If the Flux is not equal to the specified value or not within the specified range of the values (No at 405), the process goes to step 406 where said flow rate of charged particles Flux is whether greater than the specified value Y or not. If the Flux is greater than the specified value Y (Yes at 406), the gas pressure in the reaction chamber is decreased. If the Flux is less than the specified value (No at 406), the process goes to step 408, where said gas pressure is increased.

In the case where said gas pressure has been increased, the process goes to step 409 where said gas pressure is checked as to whether it is less than a specified value Z. If said gas pressure is equal to or not less than the specified value Z (No at 409), the process goes to step 410, where the output frequency from the high-frequency power supply 6 is increased.

After said steps 401 and 410 have been executed, or after said gas pressure becomes less than the specified value Z (Yes at 409), the process returns to step 401.

If the Flux is equal to the specified value or within the specified range (Yes at 405), the energy Eion and the flow rate of charged particles are assumed to have been set correctly, and this program ends.

Description is hereunder made for an example of evaluating damages to a device placed on said electrode 3 (leakage current from PN junction) in an etching process performed with an RIE device having the configuration as described above.

Figure 5:
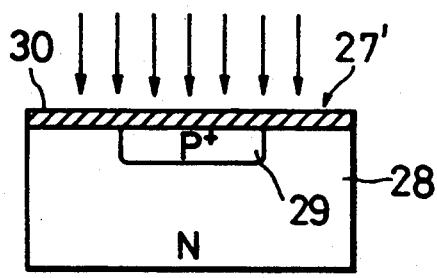
FIG. 5 illustrates the cross-section of a junction structure on which a test device for evaluating a leakage current is built.
Figure 6:
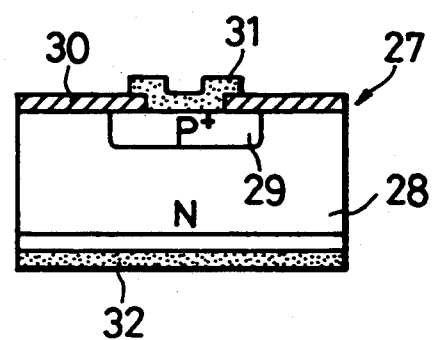
FIG. 6 illustrates the cross-section of said test device.

FIG. 5 illustrates a PN junction device 27' on which a test device 27 for evaluation is built. The procedure of producing the junction device 27' is described below.

First, an oxide film is formed on an N-type Si substrate 28 having the specific resistance of 0.2 Ω/cm, and then a portion of said oxide film is removed so that a polonium silicate glass (PSG) can be stuffed therein by using the CVD method. Then the substrate 28 is processed in thermal diffusion at 1000° C. and the oxide film thereof is removed with fluoric acid to form a P+ area 29. By coating the surface of the P+ area with a $SiO_2$ film 30 having the thickness of 65 nm, the junction device 27' is produced.

Second, this junction device 27' is set in a reaction chamber of an RIE apparatus according to this embodiment, and plasma is generated under various conditions which are selected by changing an output from said high-frequency power supply 6 within a range from 50 to 200 W and the gas pressure in the reaction chamber within a range from 50 to 300 mTorr. Said junction device 27' is then exposed to said plasma.

Then, the $SiO_2$ film around the central portion of the P+ area 29 in said junction device 27' is removed with fluoric acid, and electrodes 31 and 33 are formed by using vacuum evaporation, and thus the test device 27 for evaluating a leak current is produced.

Figure 7:
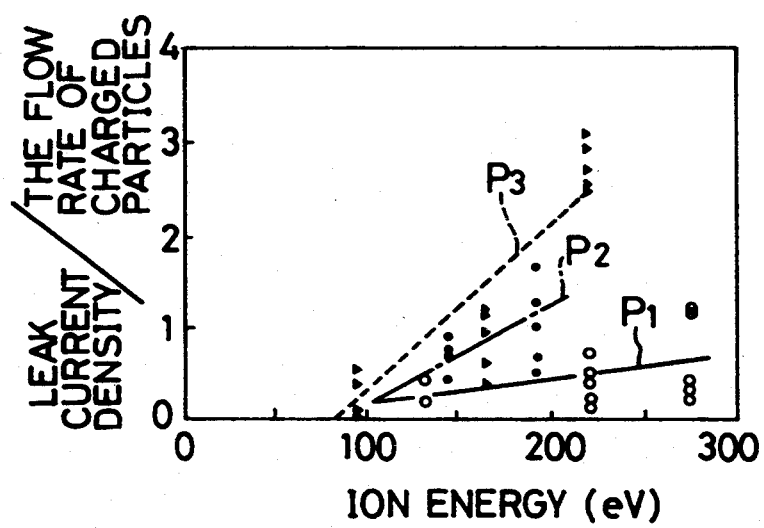
FIG. 7 illustrates the relation between the ion energy and the ratio of the leak current density to the flow rate of charged particles as to the test device, with three resulting curves each corresponding to varying pressure in the reaction chamber.

Regarding FIG. 7, a difference is obtained between the leak current density of each test device 27 and the leak current of a test device which has not been exposed to plasma. In FIG. 7, the quotient obtained by dividing the difference by the quantity of ions bombarded during said process is plotted along the ordinate and the ion energy during said process along the abscissa, using the gas pressure in said reaction chamber as a parameter, with three resulting lines P1, P2 and P3 corresponding to the gas pressures 50, 300, and 150 mTorr, respectively.

From FIG. 7, it will be appreciated that an increase in the leak current in an RIE can nearly be zeroed by setting the energy of ions bombarded according to the ion control program to below 100 eV.

In other words, with an RIE device according to this invention, damages to a device in a production process can be reduced by controlling the ion energy and the flow rate of charged particles.

Figure 8:
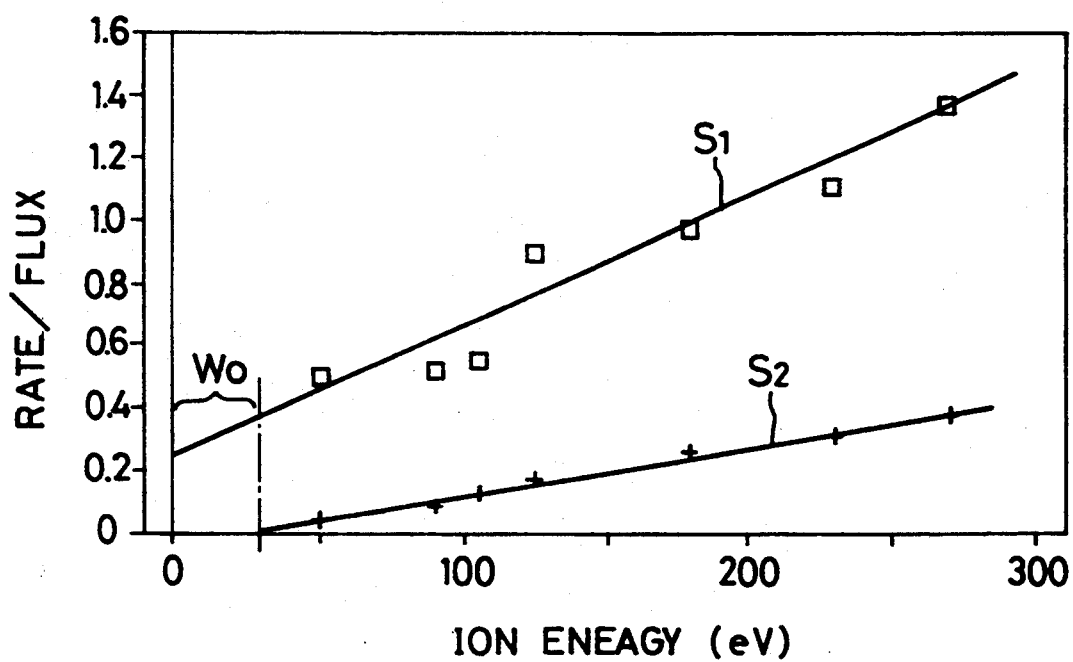
FIG. 8 is a drawing to illustrate selective etching performed by this RIE apparatus.
Figure 9:
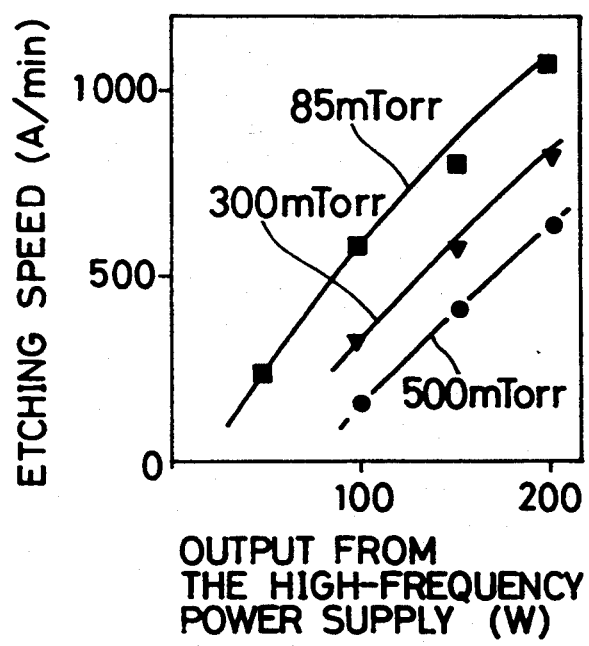
FIG. 9 is a graph showing conditions for an etching process based on the prior art.

FIG. 8 is a drawing to describe a selective etching with silicon dioxide and silicon which is performed by the RIE device. To perform the selective etching, mixed gases of $CF_4$ and $O_2$ (where a percentage of $O_2$ is 15%) are used as the etching gas fed into said reaction chamber 1.

Etching is performed with the ion energy and the flow rate of charged particles set to specified values according to said ion control program, and a change in the value obtained by dividing the etching rate, namely an etching speed per ion by the quantity of ions bombarded (in other words, a value proportional to the etching quantity per ion) is evaluated with respect to the ion energy. In FIG. 8, said etching quantity is plotted along the ordinate and the ion energy along the abscissa. Straight line $S_1$ illustrates the etching result with silicon and straight line $S_2$ the etching result with silicon dioxide.

From FIG. 8, it will be appreciated that said etching quantity is a linear function of the ion energy, and thus the etching speed can be controlled optionally by controlling the ion energy and the flow rate of charged particles. Also, it will be appreciated that, with the ion energy fixed, silicon produces larger etching quantity than silicon dioxide. This difference of the etching quantity stems from the fact that silicon has smaller energy for combination than that of silicon dioxide. For this reason, for instance, with a device built with silicon dioxide as a substance for the base substrate and silicon as a substance for the thin film to be etched, silicon can exclusively be etched at varying etching speeds by performing RIE with the ion energy within a range indicated by $W_0$ in FIG. 8, that is below 50 eV.

As described above, a reactive ion etching apparatus according to this invention, which comprises a reaction chamber having at least an exhaust means and a gas leading-in means, and also having a pair of electrodes therein to generate plasma in a space above said electrodes, wherein ions in said plasma are bombarded to an object placed on one of said electrodes to be processed, has an electrode potential detecting means which detects the electric potential of said electrodes, a high-frequency power detecting means which detects an output from said high-frequency power supply, a first computing means which computes an ion energy produced in a process of reactive ion etching based on said detected electric potential, a second computing means which computes the flow rate of charged particles related to said ions based on said detected output, and a control means which controls at least one of the following: the quantity of a gas led into said reaction chamber; an exhaust speed in the aforesaid reaction chamber; an output from said high-frequency power supply; and the frequency of the aforesaid high-frequency power, based on the result of an output from at least one of said first computing means and said second computing means, and therefore the reactive ion etching apparatus enables the ion energy of ions produced in said plasma and the flow rate of charged particles to be controlled easily, smoothly and with repeatability, and also various conditions such as an etching speed to be set easily.

Furthermore, the ion energy and the flow rate of charged particles can directly be controlled from the outside of the reaction chamber, which can prevent a problem of contamination in said reaction chamber, and also said direct control can be used to reduce damages to a semiconductor device to be processed in RIE and improve the quantity of a semiconductor device.

For this reason, an RIE device according to this invention, which can use a conventional device as its mainframe whose core section is a reaction chamber, can increase efficiency in work and thus be effectively applied to works at industrial production sites.

What we claim is:

1. A reactive ion etching device comprising:
   a reaction chamber having a gas inlet and an exhaust outlet;
   at least two electrodes disposed in said reaction chamber;
   a high-frequency power supply connected to one of said electrodes to generate plasma in a space between said electrodes, wherein ions in said plasma are bombarded onto an object placed on said one electrode to be processed;
   a high-frequency power detecting means for detecting an output from said high-frequency power supply;
   an electrode potential detecting means for detecting an electric potential of said one electrode;
   first computing means for computing a first value representing an ion energy of said ions produced in a process of reactive ion etching based on a value of self-bias formed on said one electrode and a value of amplitude of high-frequency electric potential generated on said one electrode;
   second computing means for computing a second value representing a flux of charged particles related to said ions based on said output; and control means for controlling at least one of the following so that at least one of the first and second values computed by said first computing means and said second computing means, respectively, falls within a range of optimal values for one of said ion energy and said flux: the quantity of a gas fed into said reaction chamber, an exhaust speed from said reaction chamber, a power supply output from said high-frequency power supply, and a frequency of said high-frequency power, wherein said control means controls said high-frequency power so that said high-frequency power increases if said ion energy is smaller than a set value, and said high-frequency power decreases if said ion energy is larger than said set value.

2. A reactive ion etching device comprising:

a reaction chamber having a gas inlet and an exhaust outlet;

at least two electrodes disposed in said reaction chamber;

a high-frequency power supply connected to one of said electrodes to generate plasma in a space between said electrodes, wherein ions in said plasma are bombarded onto an object placed on said one electrode to be processed;

a high-frequency power detecting means for detecting an output from said high-frequency power supply;

an electrode potential detecting means for detecting an electric potential of said one electrode;

first computing means for computing a first value representing an ion energy of said ions produced in a process of reactive ion etching based on a value of self-bias formed on said one electrode and a value of amplitude of high-frequency electric potential generated on said one electrode;

second computing means for computing a second value representing a flux of charged particles related to said ions based on said output; and control means for controlling at least one of the following so that at least one of the first and second values computed by said first computing means and said second computing means, respectively, falls within a range of optimal values for one of said ion energy and said flux: the quantity of a gas fed into said reaction chamber, an exhaust speed from said reaction chamber, a power supply output from said high-frequency power supply, and a frequency of said high-frequency power, wherein said control means controls pressure in said reaction chamber so that said exhaust speed from said reaction chamber increases or said quantity of a gas fed into said reaction chamber decreases if said flux is larger than a set value, and said exhaust speed from said reaction chamber decreases or said quantity of a gas fed into said reaction chamber increases if said flux is smaller than said set value.

3. The reactive ion etching device according to claim 2, wherein said control means controls said frequency of said high-frequency electric power so that said frequency increases if the pressure in said reaction chamber is larger than a set value.

4. A reactive ion etching device comprising:

a reaction chamber having a gas inlet and an exhaust outlet;

at least two electrodes disposed in said reaction chamber;

a high-frequency power supply connected to one of said electrodes to generate plasma in a space between said electrodes, wherein ions in said plasma are bombarded onto an object placed on said one electrode to be processed;

a high-frequency power detecting means for detecting an output from said high-frequency power supply;

an electrode potential detecting means for detecting an electric potential of said one electrode;

first computing means for computing a first value representing an ion energy of said ions produced in a process of reactive ion etching based on said electric potential;

second computing means for computing a second value representing a flux of charged particle ions based on a value of the high-frequency electric power supplied to said one electrode and a value of amplitude of high-frequency electric potential generated on said one electrode; and control means for controlling at least one of the following so that at least one of the first and second values computed by said first computing means and said second computing means, respectively, falls within a range of optimal values for one of said ion energy and said flux: the quantity of a gas fed into said reaction chamber, an exhaust speed from said reaction chamber, a power supply output from said high-frequency power supply, and a frequency of said high-frequency power, wherein said control means controls said high-frequency power so that said high-frequency power increases if said ion energy is smaller than a set value, and said high-frequency power decreases if said ion energy is larger than said set value.

5. A reactive ion etching device comprising:

a reaction chamber having a gas inlet and an exhaust outlet;

at least two electrodes disposed in said reaction chamber;

a high-frequency power supply connected to one of said electrodes to generate plasma in a space between said electrodes, wherein ions in said plasma are bombarded onto an object placed on said one electrode to be processed;

a high-frequency power detecting means for detecting an output from said high-frequency power supply;

an electrode potential detecting means for detecting an electric potential of said one electrode;

first computing means for computing a first value representing an ion energy of said ions produced in a process of reactive ion etching based on said electric potential;

second computing means for computing a second value representing a flux of charged particle ions based on a value of the high-frequency electric power supplied to said one electrode and a value of amplitude of high-frequency electric potential generated on said one electrode; and control means for controlling at least one of the following so that at least one of the first and second values computed by said first computing means and said second computing means, respectively, falls within a range of optimal values for one of said ion energy and said flux: the quantity of a gas fed into said reaction chamber, an exhaust speed from said reaction chamber, a power supply output from said high-frequency power supply, and a frequency of said high-frequency power, wherein said exhaust speed from said reaction chamber increases or said quantity of a gas fed into said reaction chamber decreases if said flux is larger than a set value, and said exhaust speed from said reaction chamber decreases or said quantity of a gas fed into said reaction chamber increases if said flux is smaller than said set value.

6. The reactive ion etching device according to claim 5, wherein said control means controls said frequency of said high-frequency electric power so that said frequency increases if the pressure of said reaction chamber is larger than a set value.

7. A reactive ion etching device comprising:
a reaction chamber having a gas inlet and an exhaust outlet;
at least two electrodes disposed in said reaction chamber;
a high-frequency power supply connected to one of said electrodes to generate plasma in a space between said electrodes, wherein ions in said plasma are bombarded onto an object placed on said one electrode to be processed;
a high-frequency power detecting means for detecting an output from said high-frequency power supply;
an electrode potential detecting means for detecting an electric potential of said one electrode;
first computing means for computing a first value representing an ion energy of said ions produced in a process of reactive ion etching based on a value of self-bias formed on said one electrode and a value of amplitude of high-frequency electric potential generated on said one electrode;
second computing means for computing a second value representing a flux of charged particles related to said ions based on said output; and
control means for controlling at least one of the following so that at least one of the first and second values computed by said first computing means and said second computing means, respectively, falls within a range of optimal values for one of said ion energy and said flux: the quantity of a gas fed into said reaction chamber, an exhaust speed from said reaction chamber, a power supply output from said high-frequency power supply, and a frequency of said high-frequency power, wherein said frequency of said high-frequency electric power increases if said ion energy is larger than a set value for said ion energy or said flux is smaller than a set value for said flux, and said frequency decreases if said ion energy is smaller than said set value for said ion energy or said flux is larger than said set value for said flux.

8. A reactive ion etching device comprising:
a reaction chamber having a gas inlet and an exhaust outlet;
at least two electrodes disposed in said reaction chamber;
a high-frequency power supply connected to one of said electrodes to generate plasma in a space between said electrodes, wherein ions in said plasma are bombarded onto an object placed on said one electrode to be processed;
a high-frequency power detecting means for detecting an output from said high-frequency power supply;
an electrode potential detecting means for detecting an electric potential of said one electrode;
first computing means for computing a first value representing an ion energy of said ions produced in a process of reactive ion etching based on said electric potential;
second computing means for computing a second value representing a flux of charged particles ions based on a value of the high-frequency electric power supplied to said one electrode and a value of amplitude of high-frequency electric potential generated on said one electrode; and
control means for controlling at least one of the following so that at least one of the first and second values computed by said first computing means and said second computing means, respectively, falls within a range of optimal values for one of said ion energy and said flux: the quantity of a gas fed into said reaction chamber, an exhaust speed from said reaction chamber, a power supply output from said high-frequency power supply, and a frequency of said high-frequency power, wherein said frequency of said high-frequency electric power increases if said ion energy is larger than a set value for said ion energy or said flux is smaller than a set value for said flux, and said frequency decreases if said ion energy is smaller than said set value for said ion energy or said flux is larger than said set value for said flux.

* * * * *